United States Patent [19]
Erjavic et al.

[11] Patent Number: 5,489,843
[45] Date of Patent: Feb. 6, 1996

[54] APPARATUS AND METHOD FOR TESTING THE CALIBRATION OF ELECTRONIC PACKAGE LEAD INSPECTION SYSTEM

[75] Inventors: Scott A. Erjavic, Danville; Lawrence E. Spanton, San Jose, both of Calif.

[73] Assignee: VLSI Technology, Inc., San Jose, Calif.

[21] Appl. No.: 734,658

[22] Filed: Jul. 23, 1991

[51] Int. Cl.$^6$ .................................................. G01R 35/00
[52] U.S. Cl. ............................................................ 324/158.1
[58] Field of Search ............................... 324/158 R, 74, 324/158.1; 228/103, 105, 173.5; 29/593, 705; 364/552

[56] References Cited

U.S. PATENT DOCUMENTS

| | | | |
|---|---|---|---|
| 3,039,604 | 6/1962 | Bickel et al. | 324/158 F |
| 3,665,504 | 5/1972 | Silverman | 324/404 |
| 4,224,744 | 9/1980 | Siegel et al. | 228/103 |
| 4,686,637 | 8/1987 | Linker, Jr. et al. | 29/593 |
| 4,704,700 | 11/1987 | Linker et al. | 29/741 |
| 4,736,108 | 4/1988 | Comstock et al. | 250/223 R |
| 4,737,845 | 4/1988 | Susuki et al. | 228/105 |
| 4,759,073 | 7/1988 | Shah et al. | 228/103 |
| 4,827,436 | 5/1989 | Sabersky et al. | 250/561 |
| 4,899,921 | 2/1990 | Bendat et al. | 228/105 |

OTHER PUBLICATIONS

Product brochure by Dana Design, Petaluma, California entitled "Golden Units for Accuracy and Performance Verification", 1991.

Primary Examiner—Ernest F. Karlsen

[57] ABSTRACT

A verification unit resembling certain aspects of an electronic package is used for testing the proper calibration of lead inspection systems. Comparison of readings provided by the system when the unit is inspected to actual values will indicate whether the system is properly calibrated.

61 Claims, 8 Drawing Sheets

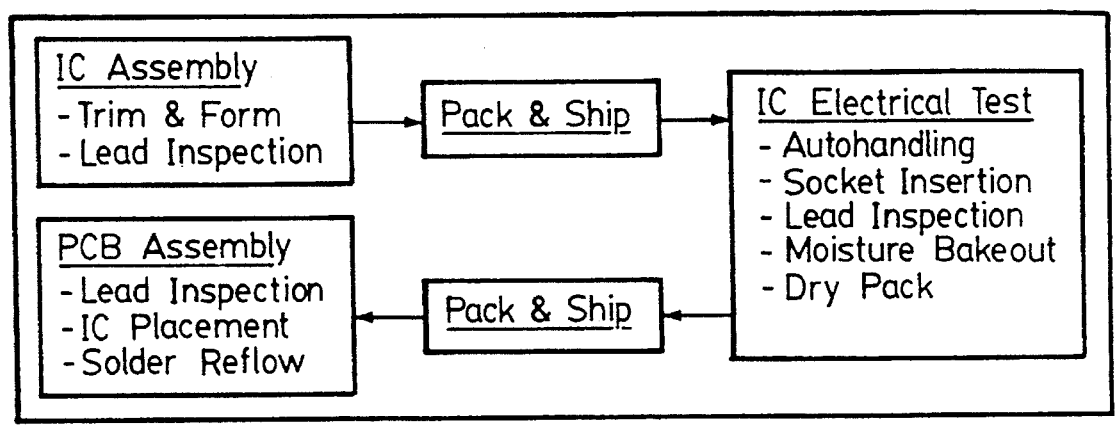
FIG._1.
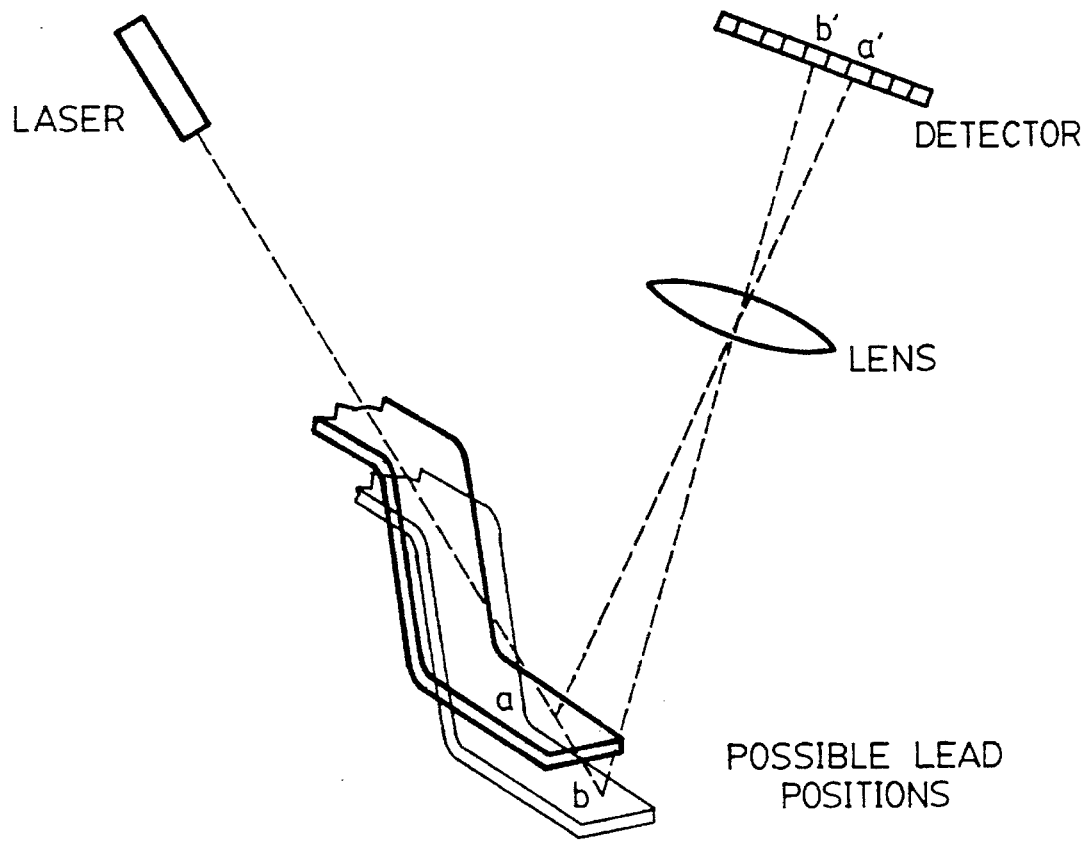
FIG._2.

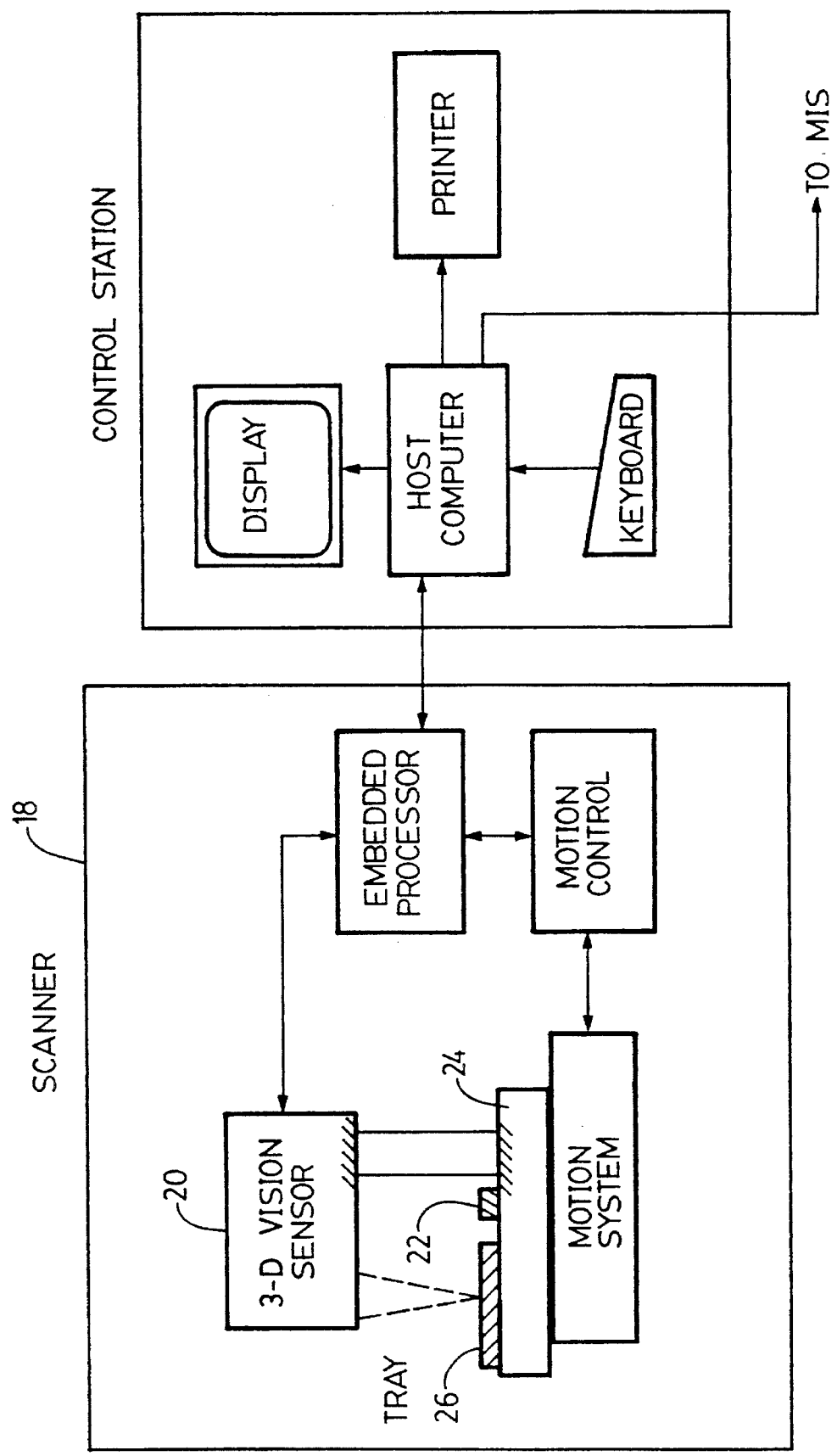
FIG._3.

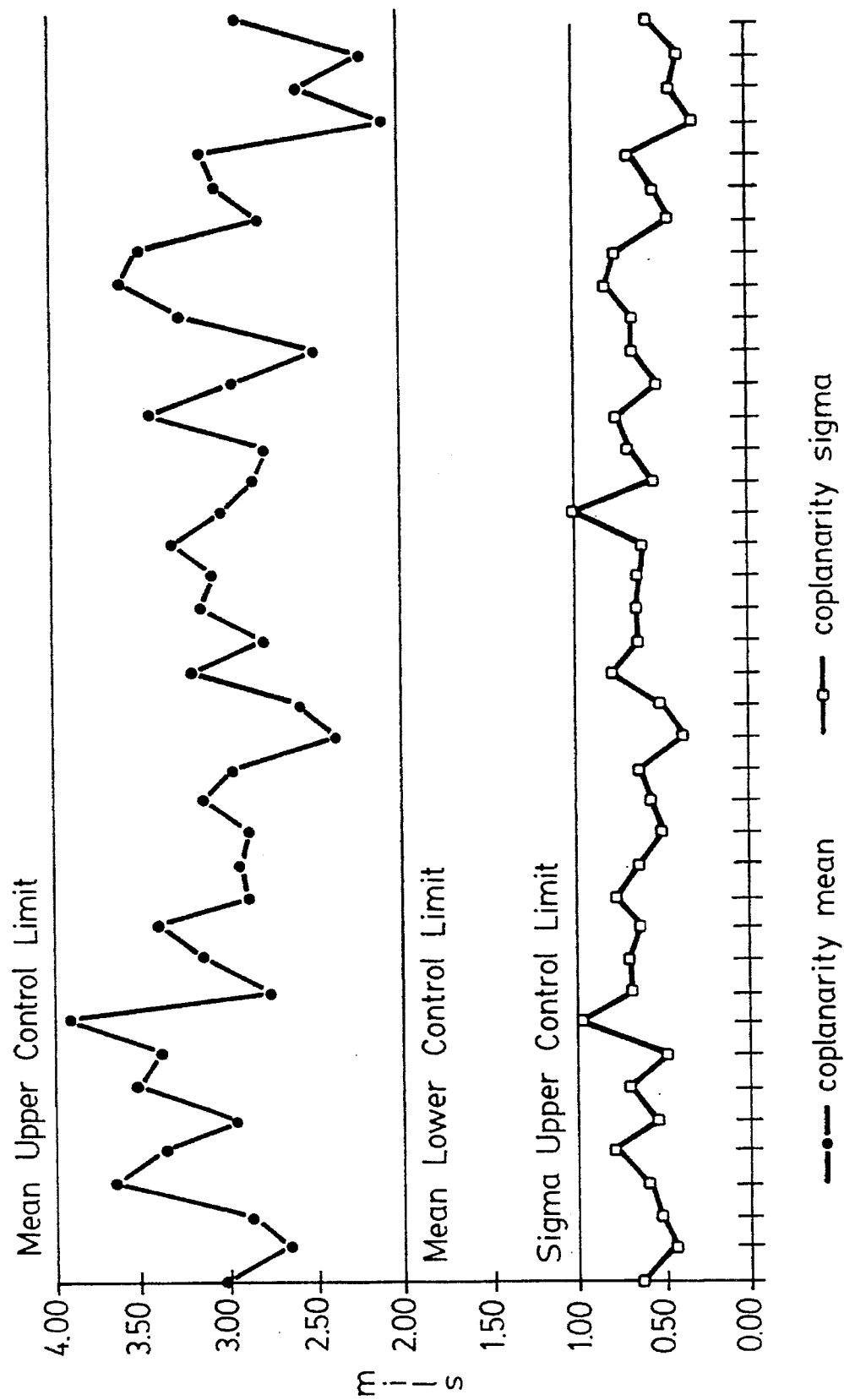
FIG._4.

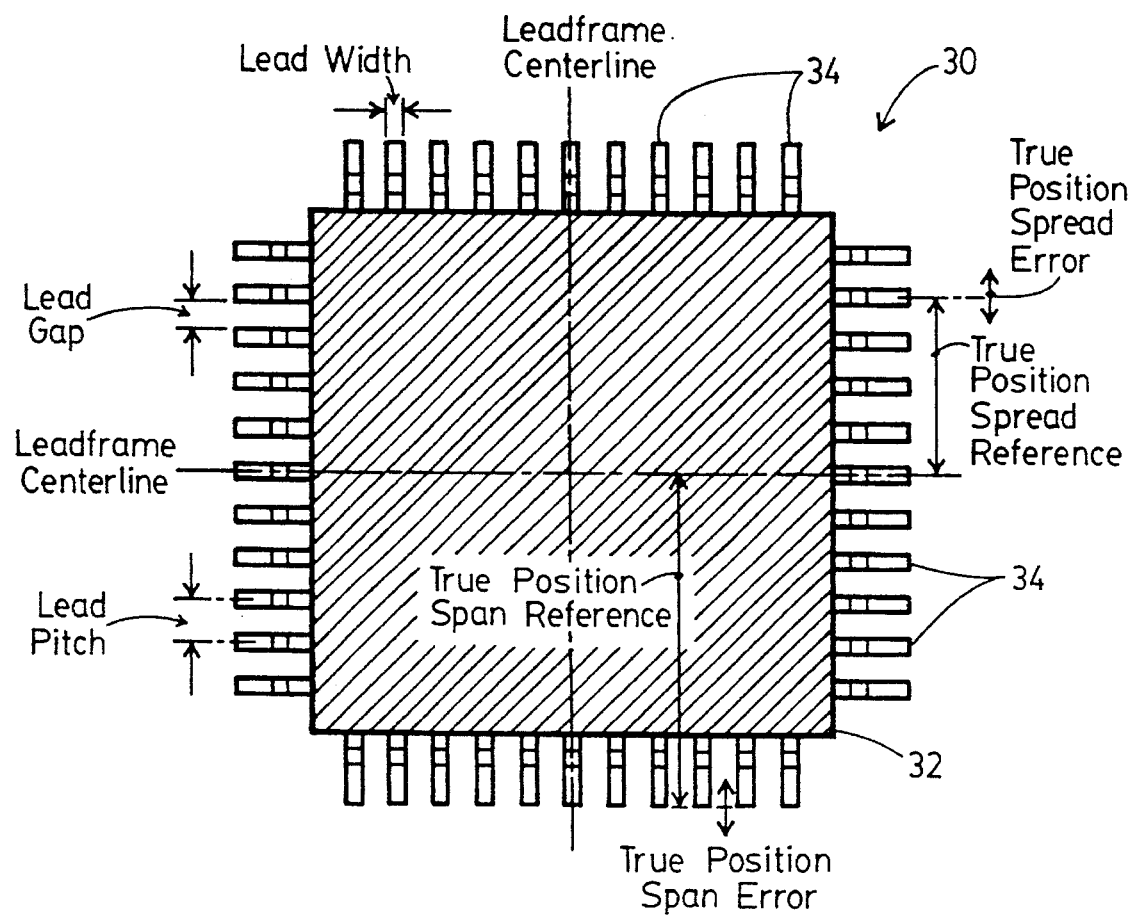
FIG._5A.
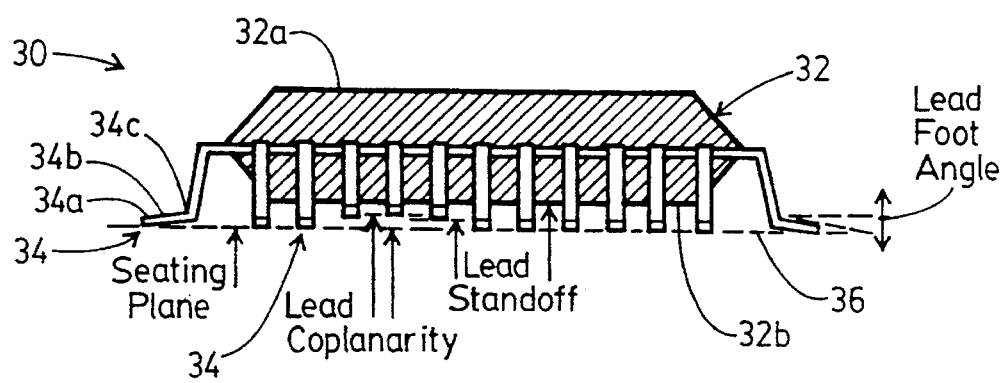
FIG._5B.

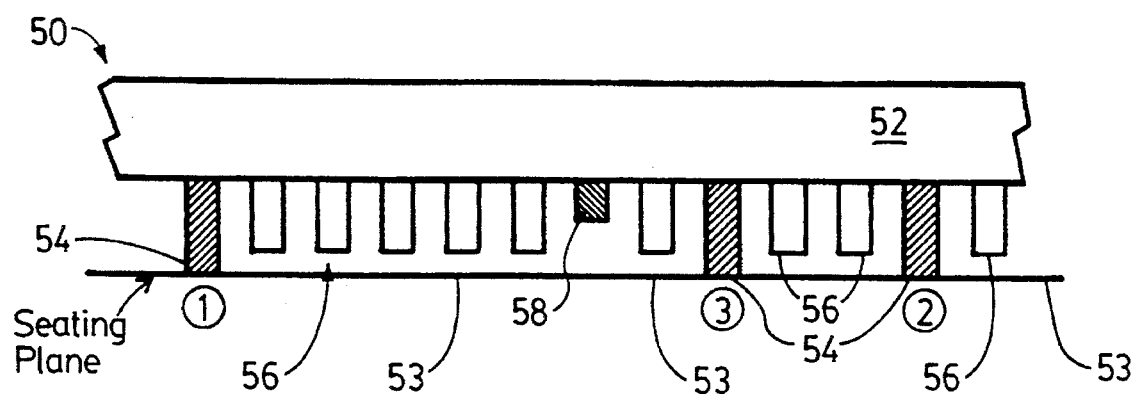
FIG._6.
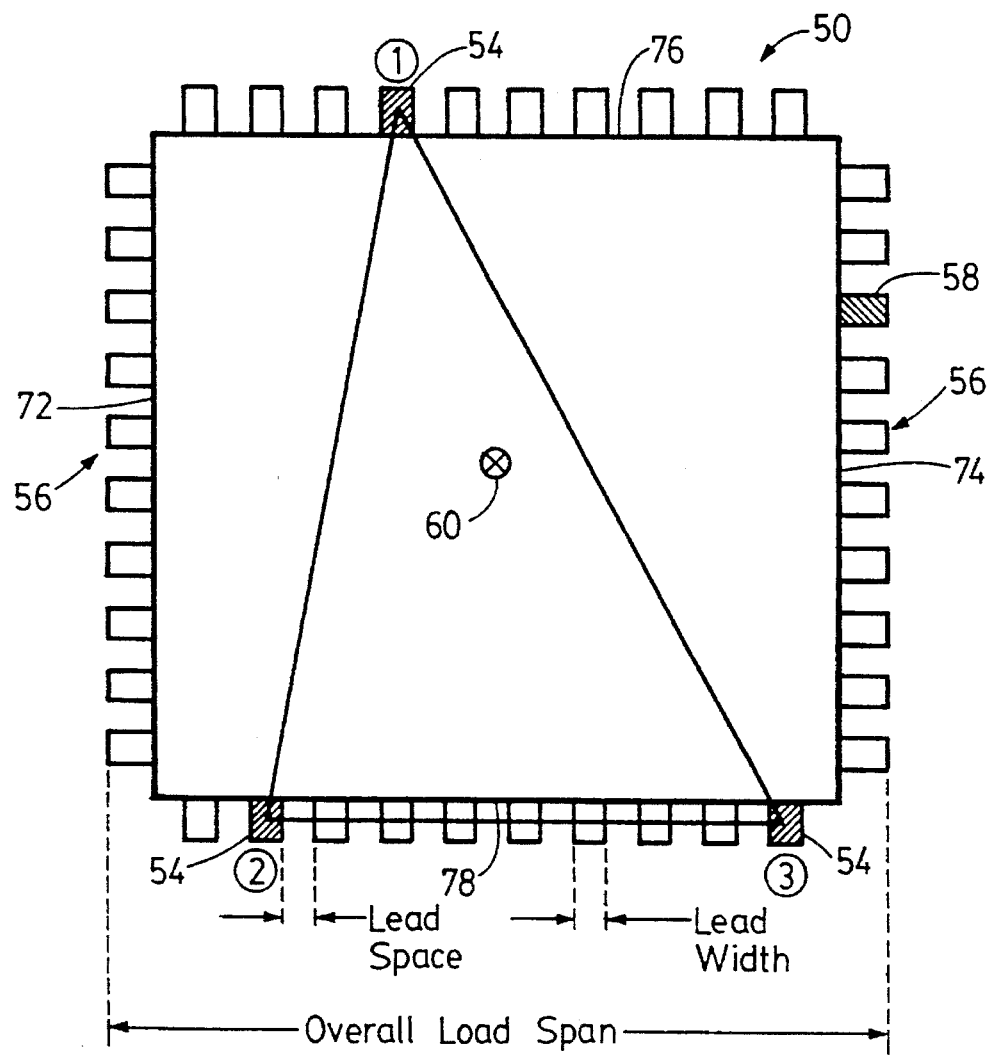
FIG._7.

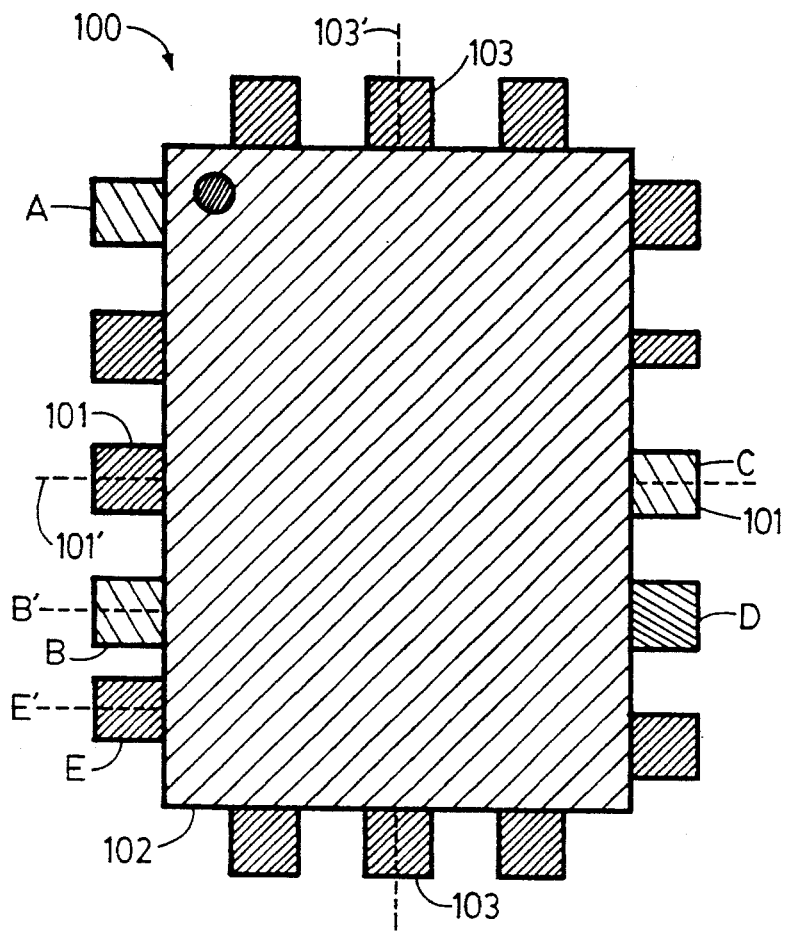
FIG._8A.
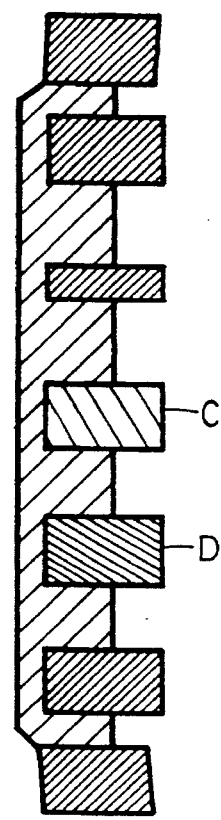
FIG._8C.
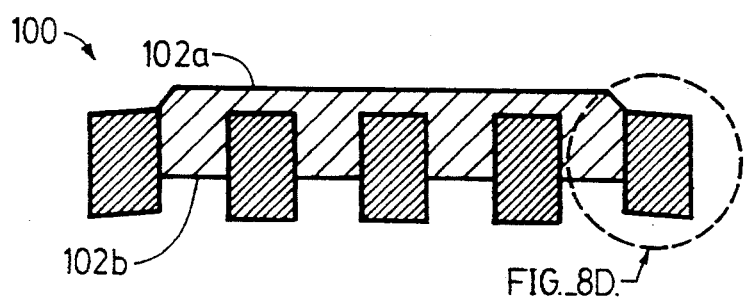
FIG._8B.
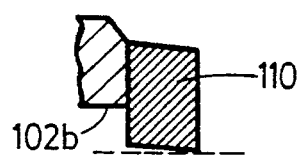
FIG._8D.

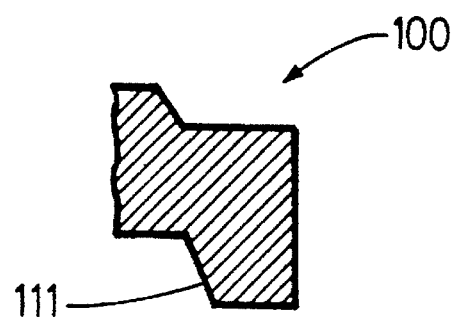
FIG._8E.
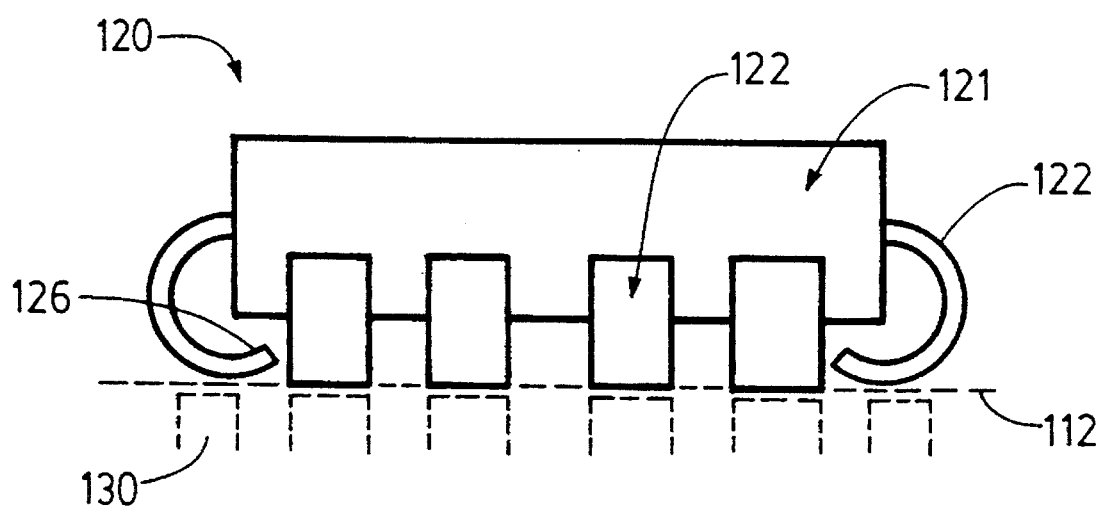
FIG._9.

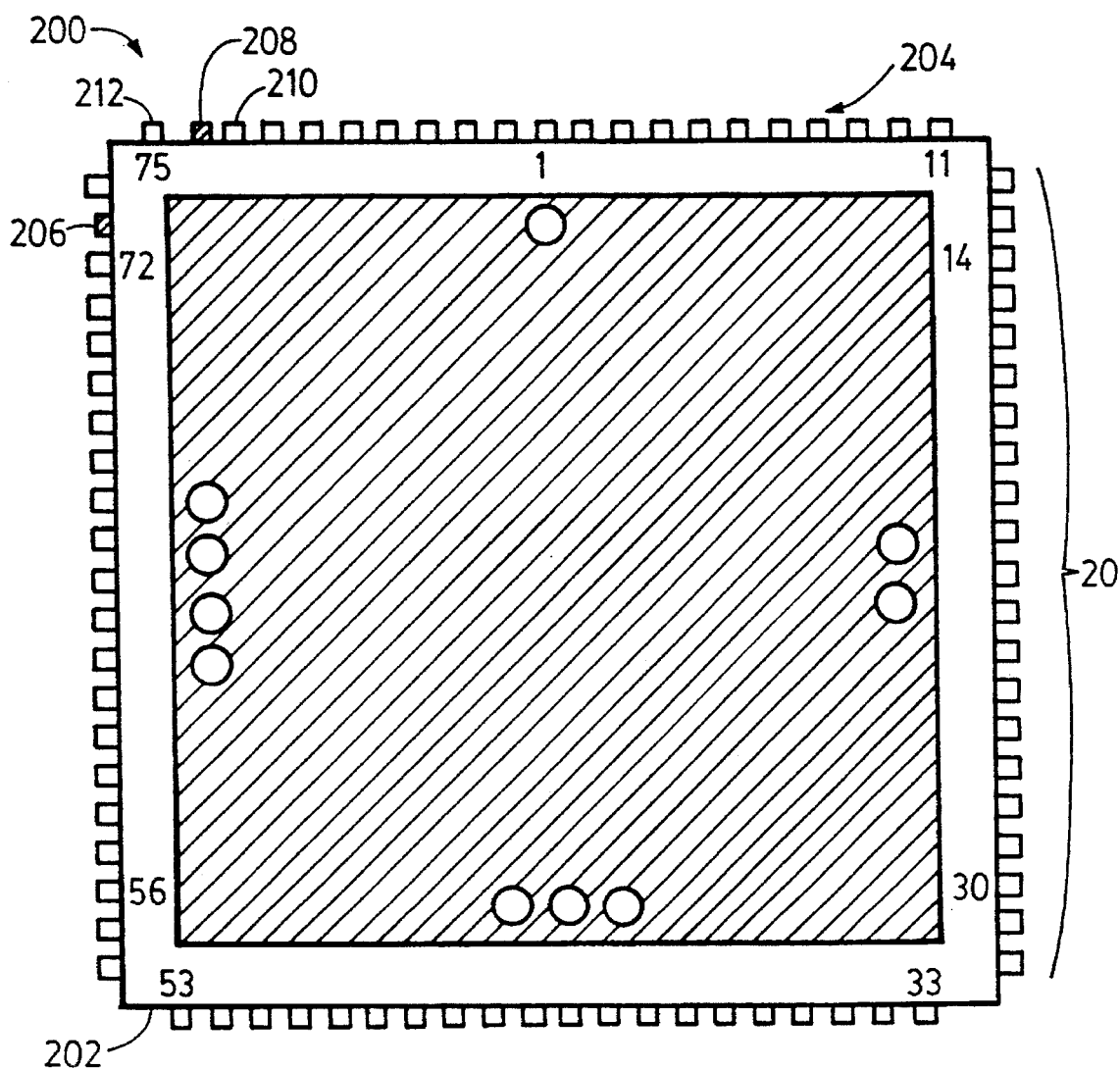
FIG._10.

APPARATUS AND METHOD FOR TESTING THE CALIBRATION OF ELECTRONIC PACKAGE LEAD INSPECTION SYSTEM

BACKGROUND OF THE INVENTION

This invention relates in general to electronic packaging technology and in particular, to apparatus and method for testing the calibration of electronic package lead inspection system.

With increasing pressure to reduce electronic package size such as the size of packages for semiconductor dies, the trend in packaging technology is to reduce the size of the leads in order to increase pin counts. As pin counts of devices increase, characteristics such as lead coplanarity and lead-to-trace registration and other parameters become critical for the printed circuit board (PCB) assemblers. Poor package coplanarity will result in open connections between package pins and PCB traces, and poor lateral registration can result in open, shorts and misconnections. Due to customer demand, the integrated circuit (IC) manufacturers have to comply closely to customer specified package dimension parameters. No entirely satisfactory solution has been found to assure compliance with such specifications. Some compliance systems involve manual inspection using optical comparators or shadowgraphs while others are automated.

After the leads of the package have been trimmed or formed by an IC manufacturer, the leads are inspected by a lead inspection system. They are then packaged and shipped, if necessary, to a test site where they are further processed. At the test site, the leads are again inspected by a lead inspection system to ensure that the various important parameters of the leads still comply with specifications. After such further processing and testing, they are again packed and shipped to the PCB assemblers. Before the packages are mounted onto PCBs, the leads of the packages are again inspected by lead inspection systems. The above-described processing and handling of the package are illustrated in FIG. 1. FIGS. 1–4 as well as much of the discussion in the background of the invention have been taken from an article entitled "3-D Scanner for Quad Flat Package Measurement and Inspection," by Scott A. Erjavic and Sullivan Chen; the article will be published in the 1991 *Proceedings of Surface Mount International*. The article is incorporated herein in its entirety by reference.

Plastic leaded chip carrier type packages are normally inspected using two-dimensional imaging inspection systems. Two-dimensional inspection systems typically evaluate component geometries either by a back-lit profile or a front- or oblique-lit reflection. Some applications utilize a combination of both. Backlit imaging systems rely upon a sharp contrast being seen by the detector at the edge of the feature being inspected, i.e., the edge of the package lead. CCD arrays in the detector analyze the feature boundary for gray scaled transitions to/from black/white on adjacent array pixels. Absolute occurrence of objects on the array defines positional information with which the gray scale information is associated. In situations where pixel densities are high relative to the feature geometries, this method can provide very accurate positional information. But with a fixed density array, the ability to migrate to larger package sizes and higher lead counts and lead pitches is limited.

Quad flat pack (QFP) type packages are normally inspected using three-dimensional lead inspection systems.

FIG. 2 illustrates a three-dimensional laser scanner using a laser source. As shown in FIG. 2, the light reflected from a lead of the package is focused by a lens towards a detector. The position of the detector that senses the reflection will indicate the Z-axis height information. The technique for measurement of X-axis and Y-axis location of the lead is well known. Many lead inspection systems employ different algorithms for computing different parameters that are important when the PCB assembler aligns and attaches the leads of the package to conductive traces on the PCB. Such algorithms are implemented by means of electronic systems.

Before the leads of a package are scanned as illustrated in FIG. 2, the package must first be removed from a shipment container from a test site as shown in FIG. 1 and delivered to the lead inspection site for scanning. When the various parameters important to the PCB assembler are calculated from the detector readings, various assumptions are made on the positions of the lead in relation to the laser and the detectors. Thus if the system for placing the package places the package at a location relative to the laser and detectors slightly different than what is assumed, the readings of the detectors will provide an inaccurate measurement of the parameters. The components in the electronics system for performing a different algorithm for calculating the parameters may also experience drift. All such factors may introduce slight variations or even large errors in the parameter measurements. A functional block diagram of a conventional laser inspection system is shown in FIG. 3.

To assist in the calibration of the scanner so that the above problems are alleviated, conventional scanner systems such as scanner 18 frequently employ a precision tool 22 of known NIST dimensions where tool 22 is at a known location relative to a 3-D sensor 20. In most cases, this means that the precision tool 22 is rigidly mounted onto the sensor support 24 which also supports a tray 26. Thus before sensor 20 is used to scan the leads in packages held in tray 26, sensor 20 is first initialized by scanning tool 22. Since tool 22 is of known NIST dimensions and at a location precisely known relative to sensor 20, the sensor can be calibrated relative to the scanner readings on the tool. Thereafter, when sensor 20 is used for scanning the leads or packages in tray 26, the sensor is sensing by reference to the tool of known NIST dimensions and at least some of the uncertainty in interpreting scanner readings will be reduced.

At the test site shown in FIG. 1, before the electronic packages are packaged and shipped to the PCB assembler, a small number (such as 35) out of a lot of packages (such as 2,000) are scanned using the scanner of FIGS. 2 and 3 to provide plots of the important parameters. These plots are compared to preset upper and lower limits in graphs such as those shown in FIG. 4 so that the scanner operator can ascertain whether the important parameters of the packages sampled are within the upper and lower limits. When such parameters sampled are within the prescribed limits, it is assumed that the same parameters for the whole lot are also within the upper and lower limits and the lot is then packaged and shipped to PCB assemblers. However, if plots of the parameters of some of the packages sampled fall outside the limits, it is then necessary to determine whether the leads of the packages are out of alignment or whether the lead inspection system or the package transport system are out of calibration.

Even with the aid of the precision tool described above, the large number of variables involved in the lead transport and lead scanning systems is such that it is still difficult to ascertain whether the lead inspection system or the package transport system itself is in error or whether the leads of the packages inspected are out of alignment. This determination is critical since misaligned packages should not be shipped to the PCB board assembler without any correction measures being taken. Furthermore, since lead inspection is performed at three different locations as shown in FIG. 1, different types of scanners used at the three sites or differences in their calibration make it even more difficult to identify the source of problems should they arise.

It is therefore desirable to provide a system for testing the calibration of lead inspection systems to further alleviate the above-described problems.

SUMMARY OF THE INVENTION

The device of this invention is for testing the calibration of a system for inspecting leads of an electronic package comprising a package body and a leadframe having leads. For the purpose of proper alignment and connection to corresponding connection means, a limit of at least one predetermined position control parameter of said leads is defined relative to the leadframe or package body. When the actual positions of the leads are such that said limit is exceeded, the leads are not in proper alignment for connection to the connection means. The system for inspecting leads inspects the leads to provide readings to indicate whether the actual positions of the leads are such that said limit of at least one predetermined position control parameter is-exceeded. The device comprises a test unit. The unit has a unit body for assembling the package body and members. The members are so located and have dimensions that simulate the parameter of the leads, so that when the system is used to inspect the unit to provide readings, the readings will indicate whether the system is properly calibrated.

The method of this invention is for testing the calibration of the above-described system for inspecting leads. The method comprises providing the above-described test unit, using the system to inspect the unit and to provide readings on the parameter, and determining whether the system is properly calibrated.

BRIEF DESCRIPTION OF THE DRAWINGS

FIG. 1 is a flow diagram illustrating the process for IC package manufacture, testing and assembly.

FIG. 2 is a schematic view of a scanner and a lead to illustrate the scanner portion of the lead inspection system.

FIG. 3 is a functional block diagram of a lead inspection system.

FIG. 4 is a graphical illustration of the scanner readings of an important parameter (coplanarity) for indicating the condition of the leads.

FIG. 5A is a top view of a quad flat pack (QFP) package to illustrate the invention.

FIG. 5B is a side view of the package of FIG. 5A.

FIG. 6 is a schematic side view of a verification unit for testing the calibration of a lead inspection system for inspecting QFP packages to illustrate an embodiment of the invention.

FIG. 7 is a top view of the unit of FIG. 6.

FIG. 8A is a top view of a verification unit for testing the calibration of a lead inspection system for inspecting QFP packages to illustrate the preferred embodiment of the invention.

FIGS. 8B, 8C are two side views of the unit of FIG. 8A, viewing the unit in directions perpendicular to each other.

FIG. 8D is a cross-sectional view of a portion of the unit of FIG. 8B.

FIG. 8E is a cross-sectional view of a portion of the unit of FIG. 8B to illustrate the invention.

FIG. 9 is a side view of a simplified plastic leaded chip carrier (PLCC) package for illustrating the invention.

FIG. 10 is a top view of a verification unit for testing the calibration of a lead inspection system for inspecting a PLCC type package to illustrate an alternative embodiment of the invention.

DETAILED DESCRIPTION OF THE PREFERRED EMBODIMENT

FIG. 5A is a top view of a QFP type package for the purpose of illustrating the important parameters used in aligning the leads to conductive traces of PCBs and to physically attach and electrically connect the leads to such traces. While package 30 of FIG. 5A is shown to have only forty-four leads 34, it will be understood that the concept of the invention is applicable for testing the reliability of lead inspection systems for inspecting packages with a greater number or smaller number of leads as well. The same is true for other packages shown in the figures of this application, including the PLCC package of FIG. 9 described below.

The most convenient frame of reference for the positions of the leads is the leadframe. The leadframe center line is determined as a result of a least squares fit calculation on a definable center grouping of leads from opposite sides of the leadframe; corner leads are specifically excluded from this grouping. Such calculation is known to those skilled in the art and will not be elaborated here. A true position spread reference is calculated for each lead on the package. The references extend from a side leadframe center line to the expected location of the center of each lead tip on the same side, as specified in FIG. 5A. One definition of the true position spread error is the deviation (side-to-side) of the lead tip center from the expected reference position. The true position span reference is calculated for each lead on the package. The reference extends from a leadframe center line to the expected location of the tip of each lead on the sides parallel to the center line, as specified in FIG. 5A.

For proper alignment with the trace footprint of the PCB, the key lead form parameters include the lead width, lead gap, lead pitch, true positions spread error, and true positions span error. Lead width is the width of the lead measured at the lead tip. Lead gap is the space between adjacent lead tips and lead pitch is the distance between center lines of adjacent lead tips.

Another set of key lead form parameters is illustrated in reference to FIG. 5B. As shown in FIG. 5B, package 30 has a package body 32 and leads 34. Body 32 is in the shape of a plate and has a top surface 32a and a bottom surface 32b which defines a base plane. When package 30 is placed on a PCB with surface 32a on top and surface 32b facing the PCB, the ends 34a of leads 34 will rest on and be in contact with the top surface 36 of a PCB.

When the package is placed on a flat surface to simulate the PCB with the bottom surface 32b facing the flat surface, the package 30 will actually come to rest on a minimum of three leads. These are the lowest leads of the package, and the surface upon which they rest is defined as the seating plane 36. When viewed from above, the center of gravity of the package (usually the center of the package body) must be contained in the triangle defined by the three lowest leads. Each device has its own seating plane. Each lead has a value of coplanarity relative to the seating plane. The lowest point of each lead is the point of measurement. The three or more leads which define the seating plane have a coplanarity value of "0;" every other lead has a positive coplanarity because they are each higher than the seating plane. The maximum of the individual lead coplanarity values is additionally considered as the coplanarity of the device itself.

Another key parameter is the lead standoff. Each lead has a value of standoff relative to the planar surface defined by the bottom of the package body, or the base plane. The measured value of each lead's lowest point from the base plane is defined as its lead standoff. The device standoff is defined as the minimum distance of the base plane 32b from the seating plane 36. Another important lead form parameter is the lead foot angle, which is the inclination or declination in degrees of the tip 34a of the lead "foot" (lower form section) 34b from the "heel" (lower form bend) 34c of the lead, relative to the seating plane 36. Positive values of lead foot angle indicate that the tip is lower than the heel; negative values indicate that the tip is higher than the heel.

This invention is based on the observation that a verification unit resembling package 30 of FIGS. 5A, 5B may be constructed from a sturdy material and have such dimensions that the key lead form parameters such as those listed above can be simulated. Then when the scanner 18 of FIG. 3 is used to scan such verification unit, the readings of the scanner can be compared to the key parameters simulated by the verification unit in order to determine whether the scanner as well as other portions of the lead inspection system have been properly calibrated. This invention is based also on the observation that, unlike the precision tool which is fixedly mounted onto the scanner support, exact duplicates of the verification unit can be made for use at all three sites shown in FIG. 1, thereby serving as a common reference for the purpose of testing the calibration of lead inspection systems at all three sites.

FIG. 6 is a schematic side view of a verification unit 50 for testing the calibration of a lead inspection system for inspecting QFP packages to illustrate an embodiment of the invention. As shown in FIG. 6, verification unit 50 has a unit body 52 which resembles package body 32 of FIGS. 5A, 5B, and lead resembling members which resemble leads 34. Again a seating plane 53 is defined by the lowest points of the three lowest lead resembling members 54. The remaining members 56, 58 all have positive coplanarity. One lead resembling member 58 has a positive coplanarity which is equal to the tolerance acceptable for coplanarity of the leads, which may be 4 mils. For future packages, such tolerance may even be as small as 2 mils, in which case the coplanarity value of member 58 is 2 mils. In other words, member 58 is purposely constructed to have a higher positive coplanarity value than the remaining members where the positive coplanarity value of member 58 is equal to the outer limit of acceptable deviations from the seating plane. As a practical matter, many if not most of the deviations from coplanarity in packages will have values close to such positive coplanarity value of member 58. The remaining members 56 may have positive coplanarity values that are smaller than that of member 58. Therefore, when members 54, 56 and 58 are inspected by a lead inspection system to provide readings on coplanarity, such readings can be compared to the known positive coplanarity values of members 56 and 58 for testing the calibration of the lead inspection system.

FIG. 7 is a top view of the unit 50 of FIG. 6. As shown in FIG. 7, the three members 54 defining the seating plane form a triangle from the top view, where the triangle encloses the center of gravity 60 of the package. In this manner, when the package sits on a flat surface, the three members 54 will be the only ones in contact with the flat surface.

One of the key requirements of a verification unit is that it should not change dimensions despite rough handling. Since the actual lead widths of a QFP package such as package 30 can be as small as 10–20 mils or below, a verification unit with members resembling the leads of package 30 may become deformed upon frequent handling irrespective of the type of material used to construct the verification unit. Furthermore, with members of such small widths (10–20 mils), the limit of machine tools are such that it is difficult to construct a verification unit with precise measurements. For this reason, in the preferred embodiment, cubical blocks are used instead of the elongated lead resembling members of FIGS. 6 and 7; such blocks are shown in FIGS. 8A–8E.

FIG. 8A is a top view of a verification unit 100 to illustrate the preferred embodiment of the invention. As shown in FIG. 8A, verification unit 100 has a unit body 102 which preferably has the same dimensions as a package body such as body 32 of FIGS. 5A, 5B. Unit 100 also has a plurality of blocks either integral with or attached to the unit body. FIGS. 8B, 8C are side views of unit 100 of FIG. 8A from two directions which are perpendicular to each other. Unit body 102 has a top surface 102a and a bottom surface 102b defining a base plane. Unit 100 has a plurality of blocks surrounding body 102. Three of the blocks A, B, C have surfaces which extend the furthest from bottom surface 102b; the lowest points of the surfaces of these three blocks therefore define a seating plane. Blocks A, B, C each has a depth of 1.40 millimeters. As shown in FIG. 8C, the distance between the bottom surface of block C (and also of blocks A and B) and bottom surface 102b is about 1.4 millimeters, whereas the bottom surfaces of all the blocks except blocks A, B, C, D are 1.35 millimeters from bottom surface 102b. The bottom surface of block D, however, is only 1.3 millimeters from the bottom surface 102b. Therefore, block D has a positive coplanarity value of 0.1 millimeter and all the remaining blocks (that is, except blocks A–D) have positive coplanarity values of 0.05 millimeters. When the lead inspection system inspects bottom surface 102b and the bottom surfaces of the blocks, it will provide readings on the coplanarity values of the various blocks. A comparison of such readings to the actual values, such as those shown in FIG. 8C, will indicate whether the lead inspection system has been properly calibrated.

As shown in FIG. 8A, the blocks simulate a lead pitch of 4 millimeters, lead widths of 1 and 2 millimeters, and lead gaps of 1 millimeter and 2.5 millimeters. In order to achieve precise measurements of the members, the blocks preferably have widths not less than about 0.5 mm, and the gaps between adjacent pairs of blocks are not less than about 0.5 mm.

FIG. 8D is a cross-sectional view of a portion of unit 100 of FIG. 8B. As shown in FIG. 8D, the bottom surface of one of the blocks 110 is not parallel to the bottom surface 102b and is at a slight angle of about 5° as shown in FIG. 8D to the base plane. Thus when the lead inspection system inspects such surface, it will provide a reading or such angle which simulates the lead foot angle. Comparison of such reading to the actual value of the angle will indicate whether the system is properly calibrated. As shown in FIGS. 8A–8E, the blocks or members extend from the sides of plate 102 by distances in the 1–2 millimeter range, defining the span of the blocks. As shown in FIGS. 8A, 8D, the device standoff (minimum distance between base plane and seating plane) is in the 1.30–1.40 millimeter range. It is preferable for such device standoff to be not less than about 0.5 mm so that unit 100 is easier to construct; it will be understood, however, to resemble an actual devise standoff, unit 100 may be modified so that the device standoff is in the range of 0–20 mils. In the same vein, the bottom surface of block 110 may be at an angle in a range of about 0°–8° to the base or seating plane. As shown in FIG. 8D, block 110 has the same vertical dimension (i.e., the dimension that is perpendicular to the base plane 102b), which is 3.31 millimeters. Therefore, also shown in FIG. 8D, the top surface of block 110 is also at a selected angle to the base plane; in the embodiment illustrated in FIG. 8D, such angle is 5°. Similarly, all sixteen blocks of unit 100 in FIG. 8A have the same vertical dimension.

As indicated above in reference to FIG. 8A–8E, in order to achieve precise measurements, blocklike members are used instead of lead resembling members. For this season, the number of members are smaller than the number of leads in the corresponding package. As shown in FIG. 8A, the unit body 102 is in the shape of a rectangular plate of a certain thickness, and has a length and width. If the length of the unit is 20 millimeters with a width of 14 millimeters, the number of members may be within the range of 10–100. Where the unit body is at 28 millimeter square plate, the number of members may be in the range of 20–208.

In general, semiconductor packages are designed such that where the number of leads on one side of the package is even-numbered, the leads are evenly distributed so that the distance between adjacent leads are the same and so that there is a center gap between adjacent leads located at the mid-point of such side of the package body. Where the number of leads on one side are odd-numbered, there would be a center lead located at the midpoint of the package body. As shown in FIG. 8A, the number of members on each of the four sides of the unit body 102 is odd-numbered (5 and 3). Center blocks 101 are each located respectively at the midpoints of the left and righthand sides of unit body 102 and center blocks 103 are located respectively each at the midpoints of the top and bottom sides of unit body 102. As shown in FIG. 8A, except for block E, whose center line E' is at a distance of 3 millimeters from the center line B' of block B, the distance between the center lines of adjacent blocks for the remaining blocks on all four sides of body 102 is about 4 millimeters. This is the case even though the block width of one of the blocks on the right side of body 102 is smaller than the block widths of the remaining blocks.

The above-described configuration of the members is useful for testing the leadframe center line calculation algorithms as implemented in the lead inspection system. First, a set of two mutually perpendicular leadframe center lines are calculated using the center blocks 101, 103. One center line 101' simply bisects both blocks 101 and the other center line 103' bisects the two blocks 103. The locations of the remaining blocks in reference to these two center lines may then be computed. A second set of center lines is then computed as follows. All sixteen blocks are included in this calculation. Thus for the five blocks each on the left and right side of body 102, all five blocks on each side are included. Since the distance between the center lines B', E' is smaller than the distance between the center lines of any other pairs of adjacent blocks, the leadframe center line calculated based on the two sets of five blocks will be different from the first set of leadframe center lines calculated based on blocks 101, 103 only. The locations of the blocks relative to the second set of leadframe center lines are then calculated. The locations of the blocks relative to the two sets of center lines computed in the manner above are then compared to preset values already calculated beforehand for unit 100 of FIG. 8A. Such comparison will indicate whether the system properly implements the leadframe center line calculation algorithm.

The description of the verification unit in reference to FIGS. 6, 7, 8A–8E herein are in reference to the testing of a lead inspection system for inspecting QFP packages. It will be understood, however, that a substantially similar unit may be constructed for testing a lead inspection system for inspecting PLCC type packages as well. For PLCC type packages, as well as for some QFP packages, it may be adequate to use a verification unit which is simpler than that described above. Such simpler type of verification unit is described below by reference to PLCC type packages. It will be understood, however, that the unit described below in reference to FIG. 10 may also be adequate for testing lead inspection systems used to inspect QFP type packages.

FIG. 9 is a schematic side view of a PLCC type package 120 to illustrate the invention. The number of leads 122 of the PLCC package shown has been reduced to simplify the drawing. Different from the QFP package, leads 122 of the PLCC package curve under the package body 121. Again the positive coplanarity values of the leads are defined with respect to a seating plane 112 in a manner similar to that described above for a QFP package.

FIG. 10 is a bottom view of a verification unit 200 resembling a PLCC type package. Unit 200 has a unit body 202 which has substantially the same dimensions as the PLCC package body 121. In reference to FIG. 9, each of the leads 122 has a predetermined proper position for proper alignment with the footprint traces 130 on the PCB. The members 204 are of the same dimensions as their corresponding leads 122 and are located relative to the unit body 202 in the same manner as the predetermined proper positions of the leads 122 relative to the leadframe (not shown) in the package or to package body 121, except that at least one of the members 206 or 208 deviates from the predetermined position of the corresponding lead. Thus when the lead inspection system inspects the-position of lead 206 or 208 relative to the unit body 202 to provide a reading, the reading will indicate whether the system is properly calibrated. Unit body 202 is a substantially flat, rectangular or square plate, where the members are distributed at or near the edges of the plate. Preferably, member 206 and/or 208 are located at or near a corner of the plate as shown in FIG. 10. The bottom surfaces of members 204 define also a seating plane similar to seating plane 112 in FIG. 9; the bottom portions of members 204, 208 are substantially in such plane whereas the bottom portion of member 206 deviates from said plane by a preset distance (not shown in FIG. 10) in a manner analogous to the QFP situation illustrated in FIG. 6. As shown in FIG. 10, member 208 is laterally displaced so that it is closer to its adjacent member on the right (210) and further away from its adjacent member to the left (212) compared to the even spacing between other members 204. When lead inspection systems inspect members 204, 206 and 208, such readings will provide readings on coplanarity, lead gap and lead pitch where a comparison of such readings to the actual values of unit 200 will indicate whether the systems are properly calibrated.

It is preferable to provide members 206, 208 at or near the corners of unit 200. Since lead inspection systems typically operate using optical principles, points at the edge of the field of vision are frequently where the greatest errors of optical instruments are located. This is due to the fact that optical systems frequently employ lenses. Therefore, if readings provided on members 206, 208 at or near a corner of unit 200 (and thus at the edge of the field of vision) indicate that the system is properly calibrated, in all likelihood the readings provided at points away from the edge of the field of vision will also be accurate.

As shown in FIG. 10, the bottom surface of unit body 202 has a cavity therein so that unit 200 is of substantially the same weight as an actual PLCC package. This may be important for the reason that vacuum systems are normally used for stopping unit 200 in a transport track and for aligning the unit to a scanner. If the weight of unit 200 differs significantly from an actual package to be measured, a vacuum system calibrated for aligning an actual package may cause unit 200 to be misaligned with respect to the scanner. In the same vein, unit 100 of FIGS. 8A–8E is preferably also of substantially the same weight as an actual QFP package so that the vacuum suction device designed to pick and place a QFP package can be suitably used to pick and place unit 100. Units 100, 200 are preferably made of a sturdy material such as stainless steel. Since lead inspection systems function by optical principles, the reflectivities of the surfaces of units 100, 200 preferably resemble the actual packages and simulate their reflectivities. In order for units 100, 200 to be rugged, it may be preferable for the surfaces of the units not to be coated, although a black oxide coating (by oxidizing the surface of the stainless steel material) has been found to be satisfactory. The black oxide coating may be accomplished, for example, by dipping the units in a solution of sodium nitrate (which contains nitrite) and then baking the units. The detailed process for making such coatings is known to those skilled in the art and will not be elaborated here. As shown in FIGS. 8A–8E, the top surface of unit body 102 is chamfered for a better fit "dead bug" (that is, upside down) into holding pockets in trays.

Where the unit body 102 is to be held "live bug" (that is, rightside up) in the holding pockets in trays, the side surfaces of the sixteen blocks of FIG. 8A adjacent to the bottom surface 102*b* of the unit body are also chamfered as shown in FIG. 8E. As shown in FIG. 8E, the chamfered surface 111 permits unit 100 to be held in a holding pocket without causing the blocks to come into contact with supporting pedestals (not shown) in the holding pockets of trays. In order for the reflectivities of units 100, 200 to resemble actual packages, it may be preferable to grind at least some of the surface face of the units to provide matted surfaces on the units. Such matted surfaces are particularly helpful when present on key surfaces such as the top and bottom sides 102*a*, 102*b* of unit body 102 and the top and bottom side of members such as member 110. These surfaces are marked by a @ in FIGS. 8B, 8C.

In the method of this invention, a test unit such as unite 100, 200 is provided. The lead calibration system is then used to inspect the unit and to provide readings on one or more key parameters for proper alignment and connection to PCB. From the readings, the system operator can then determine whether the system is properly calibrated. As shown in FIG. 4, the parameter has preset values which may be an upper and lower limit for the parameter such as coplanarity values. Therefore, in order to determine whether the system is properly calibrated, the readings are compared to the preset upper and lower limits to determine whether the readings are between the limits. In other words, when the system inspects a verification unit (100, 200) to provide plots such as those shown in FIG. 4, the plots (that is, whether the readings fall between the upper and lower limits such as shown in FIG. 4) indicate whether the system is properly calibrated. The parameters may include lead foot angle, device standoff, coplanarity, lateral spread and span, lead width, lead pitch, and lead gap.

The coplanarity values of the members may be determined as follows. First, the scanner of FIGS. 2 and 3 is used to scan the bottom surfaces of the members 54, 56, 58 of unit 50 of FIGS. 6, 7 to determine the three members 54 with the lowest surfaces when placed rightside up on a flat surface. The scanner then takes a top view scan of unit 50 and verifies that the center of gravity 60 of unit 50 (intersection of line connecting midpoints of sides 72, 74 and line connecting midpoints of side 76, 78 when viewed from top of unit 50) falls within the triangle formed by members 54. The lead inspection system of FIG. 3 then computes a seating plane from the lowest surfaces of members 54. The scanner readings on the lowest surfaces of members 56, 58 are then used for determining their coplanarity values.

Adding the step of scanning the verification units to the calibration procedure yields many benefits. Thus if any dimension of the unit is measured in the X or Y directions, such readings provide an indirect check on the accuracy of the precision tool. As noted above, the readings obtained using the verification unit provide direct checks on the proper implementation of the many calculation algorithms for calculating the above listed parameters as well as algorithms for other calculations such as the leadframe center line calculation. The lead inspection systems are used in production to inspect samples from lots or even the entire lots of packages and to provide readings in production. When compared to such production readings and to the readings obtained by using the system to inspect precision tools, the readings obtained using the system to inspect verification units 100, 200 will provide additional references for ascertaining whether the system is functioning properly. Since a large number of parameters can be verified in the same run, the source of problems such as drift can be more easily located and corrected. It is therefore desirable to use the verification unit intermittently after a predetermined number of lots or packages have been inspected to insure that proper calibration is maintained.

Incorporated by reference is an article entitled "Characteriziation and Control of PLCC and MQFP Lead Inspection Systems," by Scott A. Erjavic which is attached hereto as Appendix. The article will be published in the 1991 Proceedings of the International Test Conference.

While the invention has been described by reference to various embodiments, it will be understood that various modifications may be made without departing from the scope of the invention which is to be limited only by the appended claims.

What is claimed is:

1. A device for testing the calibration of a system for inspecting leads of an electronic package comprising a package body and a group of leads, wherein for the purpose of proper alignment and connection to corresponding connection means, a limit of at least one predetermined position control parameter of said leads is defined relative to the group of leads or package body, wherein when the actual positions of some of the leads are such that said limit is exceeded, said leads are not in proper alignment for connection to the connection means, said system inspecting said leads to provide readings to indicate whether the actual positions of the leads are such that said limit of at least one predetermined position control parameter is exceeded, said device comprising:

a test unit, said unit having a body resembling the package body, wherein said body is of substantially the same dimensions as the package body, said unit further having members extending from said body, said members being so located and having certain dimensions which differ from designed dimensions of the group of leads but which bear predetermined spatial and dimensional relationships to said designed dimensions of said leads, so that when the system is used to inspect said unit to provide readings, said readings will indicate whether the system is properly calibrated, wherein said members are sufficiently robust so as to prevent said certain dimensions from changing during rough handling of the test unit.

2. The device of claim 1, wherein the number of members is less than or the same as the number of leads.

3. The device of claim 1, wherein each lead has a predetermined proper position, and wherein the members are of such dimensions and are located relative to the body in such manner that they simulate said proper positions of at least some of said leads, except that at least one of said members deviates from the predetermined proper position of a lead by a distance that simulates said limit of at least one predetermined position control parameter, so that when the system inspects the position of said at least one member relative to said body to provide a reading, said reading will indicate whether the system is properly calibrated for detecting lead misalignment.

4. The device of claim 3, wherein said body is a substantially flat, rectangular or square plate, wherein said members are distributed at or near the edges of said plate, and wherein said at least one member is located at or near a corner of the plate.

5. The device of claim 3, wherein said members have ends, wherein except for the at least one member, the ends of the remaining members are substantially in a common plane, and wherein the end of said at least one member deviates from said plane by a preset distance.

6. The device of claim 3, wherein said members have ends, wherein the ends of the members are substantially in a common plane, and wherein the end of said at least one member is in said plane and simulates a corresponding lead but is laterally displaced in comparison to the predetermined proper position of its corresponding lead.

7. The device of claim 1, wherein said unit resembles a plastic leaded chip carrier or quad flat pack package and is suitable for testing the calibration of a system for inspecting leads of a plastic leaded chip carrier or quad flat pack package.

8. The device of claim 1, wherein said unit is made of stainless steel.

9. The device of claim 8, wherein said unit has an outer layer of black oxide.

10. The device of claim 1, wherein the body is a plate having a top surface and a bottom surface defining a base plane, and the members are distributed around the sides of the body in a manner resembling the leads being distributed around sides of the package body, and wherein three members have bottom surfaces that extend the furthest below the bottom surface of the body and that extend below the bottom surface of at least one of the remaining members, the lowest points of the surfaces of the three members defining a seating plane, said three members being at such locations around the body that when the unit is placed on top of a flat surface, said lowest points of the surfaces of the three members will contact said flat surface.

11. The device of claim 10, said unit being such that when the unit is placed on said flat surface, the center of gravity falls within a triangle formed by the lowest points as viewed from the top.

12. The device of claim 10, wherein at least said one of the remaining members has its lowest surface at a preset distance above the seating plane, so that readings provided by the system on said distance will indicate whether the system is properly calibrated, for detecting lead coplanarity errors .

13. The device of claim 12, wherein said distance is about 4 mils.

14. The device of claim 12, wherein said distance is about 2 mils.

15. The device of claim 10, wherein the distance between the base and seating planes defines the device standoff, said device standoff not less than about 0.5 mm.

16. The device of claim 10, wherein the bottom surface of at least one member is at an angle to the seating plane so that readings provided by the system on said angle will indicate whether the system is properly calibrated, for detecting lead foot angle errors.

17. The device of claim 16, wherein said angle is in the range of about 0 to 8 degrees.

18. The device of claim 1, wherein the body is a plate having a top surface and a bottom surface, said top surface having chamfered edges.

19. The device of claim 1, wherein the body is a plate having a top and a bottom surface and sides, and wherein the members extend from the sides of the plate by distances in the 1 to 2 mm range.

20. The device of claim 1, wherein one of the members has a width not less than about 0.5 mm.

21. The device of claim 47, wherein each of said members is separated by a gap, and wherein the gap between any two adjacent members is not less than about 0.5 mm.

22. The device of claim 1, wherein the body is a substantially rectangular plate about 14 by 20 mm in dimensions, and wherein the number of members is in the range of 10 to 100.

23. The device of claim 1, wherein the body is a substantially rectangular plate about 28 by 28 mm in dimensions, and wherein the number of members is in the range of 20 to 208.

24. The device of claim 1, wherein said unit has a matted surface.

25. The device of claim 24, wherein the body is a plate having a top and a bottom surface, and said members are cubic blocks in shape having top and bottom surfaces, and wherein the top and bottom surfaces of at least one member are at an angle to the bottom surface of the body, said unit having a matted surface on the top and bottom surfaces of the body and the top and bottom surfaces of said at least one member.

26. The device of claim 24, wherein the body is a plate having a top and a bottom surface, and said members are cubic blocks in shape having top, bottom and side surfaces, and wherein the side surface of at least one member adjacent to the bottom surface of the body is chamfered and at an angle greater than 90 degrees to the bottom surface of the body.

27. The device of claim 1, wherein said unit has a weight that is about the same as said package.

28. The device of claim 1, wherein the body is a plate having a top surface and a bottom surface, said bottom surface defining a cavity therein.

29. The device of claim 1, wherein the body is a substantially rectangular or square plate, and wherein the members are distributed around the perimeter of the plate so that, for three sides but not the fourth side of the plate, the distance between any pair of adjacent members is substantially equal to the distance between a different pair on the same side of the plate.

30. The device of claim 29, wherein for the fourth side, the distance between any pair of adjacent members on such side is substantially equal to the distance between a different pair on such side, except for one pair of adjacent members.

31. A method for testing the calibration of a system for inspecting leads of an electronic package comprising a package body and a group of leads, wherein for the purpose of proper alignment and connection to corresponding connection means, a limit of at least one predetermined position control parameter of said leads is defined relative to the group of leads or package body, wherein when the actual positions of the leads are such that said limit is exceeded, said leads are not in proper alignment for connection to the connection means, said system inspecting said leads to provide readings to indicate whether the actual positions of the leads are such that said limit of at least one predetermined position control parameter is exceeded, said method comprising:

providing a test unit, said unit having a body resembling the package body and having members, said members being so located and having certain dimensions which differ from designed dimensions of the group of leads but which bear predetermined spatial and dimensional relationships to said designed dimensions of said leads, so that when the system is used to inspect said unit to provide readings, said readings will indicate whether the system is properly calibrated, wherein said members are sufficiently robust so as to prevent said certain dimensions from changing during rough handling of the test unit;

using the system to inspect the unit and to provide readings on said parameter; and determining whether the system is properly calibrated, for detecting lead positional deviations.

32. The method of claim 31, wherein said parameter has preset values, and wherein said determining step includes comparing the readings to preset values of the parameter to indicate whether the system is properly calibrated, for detecting lead positional devations.

33. The method of claim 32, further comprising measuring the unit to determine said preset values of the parameter.

34. The method of claim 32, wherein said preset values are an upper limit and a lower limit of the parameter, and wherein said comparing step compares the readings to said upper and lower limits to determine whether said readings are between the upper and lower limits.

35. The method of claim 31, wherein the system is used to inspect leads of packages, and wherein said using and determining steps are repeated intermittently during such use of the system.

36. The method of claim 31, wherein a limit of each of a plurality of predetermined position control parameters of said leads is defined relative to the group of leads or package body, wherein said using step uses the system to inspect the unit and to provide readings on said parameters, and the determining step determines whether the system is properly calibrated from the readings on said parameters, said parameters including lead foot angle, standoff, coplanarity, lateral spread and span, lead width, lead pitch and lead gap.

37. The method of claim 31, further comprising:

providing a precision calibration tool;

using the system to inspect said tool to provide readings; and comparing the readings provided by the system when the unit is inspected to the readings provided by the system when the tool is inspected to verify the accuracy of the tool as a calibration tool.

38. The method of claim 31, wherein the body is a substantially rectangular or square plate, and wherein the members are distributed around the perimeter of the plate so that, the distance between any pair of adjacent members is substantially equal to the distance between a different pair on the same side of the plate, except that for one side, the distance between one pair of adjacent members is different from the distance between all other pairs of adjacent members on such side, said method further comprising:

using the system to inspect the body and the members;

using the system to compute according to a center line algorithm a first set of leadframe center lines based on a first group of members and a second set of leadframe center lines based on a second group of members, said first and second groups being such that the two sets of center lines are different, and computing the locations of members in reference to the two sets; and comparing the locations of the members computed to preset locations to evaluate the system in performing the center line algorithm.

39. The method of claim 31, further comprising:

using the system to inspect a precision calibration tool to provide readings;

using the system to inspect said electronic package to provide readings; and comparing the readings provided by the system when the unit, the tool and the package are inspected.

40. The method of claim 31, wherein one of said parameters is coplanarity, said unit having a plurality of members, three of which have surfaces that are the lowest when placed on a flat surface, the lowest surfaces of said three members defining a seating plane, wherein the distances of the members from said seating plane define the coplanarity values of such members, and wherein said using step uses the system to detect the three lowest members to determine the seating plane and the coplanarity values of the members.

41. A device for testing the calibration of a system for inspecting leads of an electronic package comprising a package body and a group of leads, wherein for the purpose of proper alignment and connection to corresponding connection means, a limit of at least one predetermined position control parameter of said leads is defined relative to the group of leads or package body, wherein when the actual positions of the leads are such that said limit is exceeded, said leads are not in proper alignment for connection to the connection means, said system inspecting said leads to provide readings to indicate whether the actual positions of the leads are such that said limit of at least one predetermined position control parameter is exceeded, said device comprising:

a test unit, said unit having a body resembling the package body, said unit further having members extending from said body, said members being so located and having certain dimensions which differ from designed dimensions of the group of leads but which bear predetermined spatial and dimensional relationships to said designed dimensions of said leads, so that when the system is used to inspect said unit to provide readings, said readings will indicate whether the system is properly calibrated;

wherein each lead has a predetermined proper position, and wherein the members are of such dimensions and are located relative to the body in such manner that they simulate said proper positions of at least some of said leads, except that at least one of said members deviates from the predetermined proper position of a lead by a distance that simulates said limit of at least one predetermined position control parameter, so that when the system inspects the position of said at least one member relative to said body to provide a reading, said reading will indicate whether the system is properly calibrated for inspection of misaligned leads; and wherein said members are sufficiently robust so as to prevent the positioning of each member from changing during rough handling of the test unit.

42. A device for testing the calibration of a system for inspecting leads of an electronic package comprising a package body and a group of leads, wherein for the purpose of proper alignment and connection to corresponding connection means, a limit of at least one predetermined position control parameter of said leads is defined relative to the group of leads or package body, wherein when the actual positions of the leads are such that said limit is exceeded, said leads are not in proper alignment for connection to the connection means, said system inspecting said leads to provide readings to indicate whether the actual positions of the leads are such that said limit of at least one predetermined position control parameter is exceeded, said device comprising:

a test unit, said unit having a body resembling the package body, said unit further having members extending from said body, said members being so located and having certain dimensions which differ from designed dimensions of the group of leads but which bear predetermined spatial and dimensional relationships to said designed dimensions of said leads, so that when the system is used to inspect said unit to provide readings, said readings will indicate whether the system is properly calibrated, wherein said members are sufficiently robust so as to prevent said certain dimensions from changing during rough handling of the test unit;

wherein the body is a plate having a top surface and a bottom surface defining a base plane, and the members are distributed around the sides of the body in a manner resembling the leads being distributed around sides of the package body, and wherein three members have bottom surfaces that extend the furthest below the bottom surface of the body and that extend below the bottom surface of at least one of the remaining members, the lowest points of the surfaces of the three members defining a seating plane, said three members being at such locations around the body that when the unit is placed on top of a flat surface, said lowest points of the surfaces of the three members will contact said flat surface, so that when the system inspects the positions of the members relative to said seating plane to provide a reading, said reading will indicate whether the system is properly calibrated for inspection of misaligned leads.

43. The device of claim 1 wherein each of said members is of a sturdy shape to prevent said certain dimensions of said members from changing during rough handling of the test unit.

44. The device of claim 43 wherein said sturdy shape is a cubical block.

45. The device of claim 1 wherein said test unit is comprised of a sturdy material to prevent said certain dimensions of said members from changing during rough handling of the test unit.

46. The device of claim 45 wherein said sturdy material is stainless steel.

47. The device of claim 1 wherein said test unit is devoid of a semiconductor die.

48. The device of claim 41 wherein each of said members is of a sturdy shape to prevent said certain dimensions of said members from changing during rough handling of the test unit.

49. The device of claim 48 wherein said sturdy shape is a cubical block.

50. The device of claim 41 wherein said test unit is comprised of a sturdy material to prevent said certain dimensions of said members from changing during rough handling of the test unit.

51. The device of claim 50 wherein said sturdy material is stainless steel.

52. The device of claim 41, wherein said unit resembles a plastic leaded chip carrier or quad flat pack package and is suitable for testing the calibration of a system for inspecting leads of a plastic leaded chip carrier or quad flat pack package.

53. The device of claim 52 wherein said test unit is devoid of a semiconductor die.

54. The device of claim 53, wherein each of said members is separated by a gap, and wherein the gap between any two adjacent members is not less than about 0.5 mm.

55. The device of claim 42 wherein each of said members is of a sturdy shape to prevent said certain dimensions of said members from changing during rough handling of the test unit.

56. The device of claim 55 wherein said sturdy shape is a cubical block.

57. The device of claim 42 wherein said test unit is comprised of a sturdy material to prevent said certain dimensions of said members from changing during rough handling of the test unit.

58. The device of claim 57 wherein said sturdy material is stainless steel.

59. The device of claim 42, wherein said unit resembles a plastic leaded chip carrier or quad flat pack package and is suitable for testing the calibration of a system for inspecting leads of a plastic leaded chip carrier or quad flat pack package.

60. The device of claim 59 wherein said test unit is devoid of a semiconductor die.

61. The device of claim 60, wherein each of said members is separated by a gap, and wherein the gap between any two adjacent members is not less than about 0.5 mm.

* * * * *